United States Patent
Ito et al.

(10) Patent No.: US 7,629,089 B2
(45) Date of Patent: Dec. 8, 2009

(54) LOW-EXPANSION GLASS SUBSTRATE FOR A REFLECTIVE MASK AND REFLECTIVE MASK

(75) Inventors: Masabumi Ito, Yokohama (JP); Hitoshi Mishiro, Takasago (JP)

(73) Assignee: Asahi Glass Company, Limited, Tokyo (JP)

( * ) Notice: Subject to any disclaimer, the term of this patent is extended or adjusted under 35 U.S.C. 154(b) by 413 days.

(21) Appl. No.: 11/519,078

(22) Filed: Sep. 12, 2006

(65) Prior Publication Data

US 2007/0009812 A1    Jan. 11, 2007

Related U.S. Application Data

(63) Continuation of application No. PCT/JP2005/008107, filed on Apr. 22, 2005.

(30) Foreign Application Priority Data

Apr. 22, 2004   (JP)   ............... 2004-127307

(51) Int. Cl.
*G03F 1/00*   (2006.01)
*B32B 9/00*   (2006.01)
(52) U.S. Cl. .......................... 430/5; 428/428
(58) Field of Classification Search .......... 430/5; 428/428, 430; 378/35
See application file for complete search history.

(56) References Cited

U.S. PATENT DOCUMENTS

| | | | |
|---|---|---|---|
| 4,111,698 A | 9/1978 | Sato | |
| 6,048,652 A | 4/2000 | Nguyen et al. | |
| 6,576,380 B2 * | 6/2003 | Davis et al. | 430/5 |
| 6,951,502 B2 * | 10/2005 | Koike et al. | 451/8 |
| 2003/0186624 A1 | 10/2003 | Koike et al. | |

FOREIGN PATENT DOCUMENTS

| | | |
|---|---|---|
| JP | 10-154321 | 6/1998 |
| JP | 2003-505891 | 2/2003 |
| WO | WO 01/07967 | 2/2001 |

OTHER PUBLICATIONS

"Specification For Extreme Ultraviolet Lithography Mask Substrates", XP009101509, Semi P37-1102, 2001, 2002, pp. 1-10.
Nakajima et al, Proceedings of SPIE, vol. 5446 (SPIE, Bellingham, WA 2004) pp. 812-823.
Documents from EP 05737006.0 dated May 13, 2008 and Oct. 15, 2008.

* cited by examiner

*Primary Examiner*—Stephen Rosasco
(74) *Attorney, Agent, or Firm*—Oblon, Spivak, McClelland, Maier & Neustadt, L.L.P.

(57) ABSTRACT

A low-expansion glass substrate for a reflective mask, wherein the glass substrate is suited for a base material of a reflective mask employed in a lithographic process in semiconductor fabrication, comprises a lateral surface, a chamfered portion and a notched portion formed along an outer periphery thereof, at least one of the lateral surface, the chamfered portion and the notched portion being provided with a mirror-finished surface.

14 Claims, 2 Drawing Sheets

LOW-EXPANSION GLASS SUBSTRATE FOR A REFLECTIVE MASK AND REFLECTIVE MASK

TECHNICAL FIELD

The present inventions relates to a low-expansion glass substrate as a base material of a reflective mask, and a reflective mask, which are employed in a lithographic process in semiconductor fabrication, in particular, which are employed in EUV (Extreme Ultra Violet) lithography.

BACKGROUND ART

Heretofore, an exposure system has been widely utilized to lithographically transfer a fine circuit pattern on a wafer to fabricate integrated circuits. Since integrated circuits have been made much finer as integrated circuits have been further integrated and been provided with higher performance, such an exposure system is required to be able to provide an image of a circuit pattern on a wafer with a long focal depth and with high resolution. As a result, research and investigation have been conducted to provide an exposure light source with a shorter wavelength. As an exposure light source, an attempt will be made to employ an ArF excimer laser (having a wavelength of 193 nm) following a g-ray (having a wavelength of 436 nm), an i-ray (having a wavelength of 365 nm) and a KrF excimer laser (having a wavelength of 248 nm), which have been employed until now. In order to cope with the next generation of integrated circuits having a circuit line width of 100 nm or below, an F2 laser (having a wavelength of 157 nm) is most likely to be employed as an exposure light source. However, it has been supposed that even such an F2 laser can only cover the generation of integrated circuits having a line width of 70 nm or above.

In such a technology trend, lithographic technologies employing an EUV ray (Extreme Ultra Violet ray) as an exposure light source have drawn attention as being regarded as being applicable through the generation of integrated circuits having a line width of 50 nm and its subsequent generations. Such an EUV ray means a ray having a wavelength range in a soft X-ray region or a vacuum ultra violet region, specifically a ray having a wavelength of from about 0.2 to about 100 nm. At the present time, research and development has been conducted on the use of a wavelength of 13.5 nm as a lithographic light source. The exposure principle of the EUV lithography (hereinbelow, referred to as the "EUVL") is the same as that of the conventional lithography in terms of transferring a mask pattern by employing a projection optical system. However, the EUVL employs a catoptric system since a dioptric system cannot be employed because of the absence of a material that allows a ray to pass therethrough in an energy region of EUV rays (see JP-A-2003-505891).

A mask employed in the EUVL is basically composed of 1) a substrate, 2) a reflective multilayer film disposed on the substrate, and 3) an absorbing material layer disposed on the reflective multilayer film. The reflective multilayer film may be configured so as to have a plurality of materials cyclically laminated on the order of nm, the materials having different refractive indexes with respect to the wavelength of an exposure ray. It has been known that typical examples of such materials include Mo and Si. Research and developments have been conducted on the use of Ta or Cr as the absorbing material layer. The substrate needs to comprise a material that has a low coefficient of thermal expansion in order to avoid distortion even under illumination of an EUV ray. Research and developments have been conducted on the use of glass having a low coefficient of thermal expansion or crystallized glass having a low coefficient of thermal expansion as the material of the substrate. The substrate may be manufactured by polishing and cleaning, with high precision, such a type of glass or crystallized glass.

In connection with a glass substrate for a magnetic recording substrate having a different application and a different function from a substrate for a reflective mask employed in such semiconductor fabrication, JP-A-10-154321 discloses that in order to prevent particles (foreign particles) from being generated, lateral surfaces (a lateral surface portion and a chamfered portion) of a glass substrate is provided with a mirror-finished surface by, e.g., mechanical polishing.

DISCLOSURE OF INVENTION

In the EUVL technology, when a foreign particle or a scratch exists on a reflective mask, the image of such a foreign particle or a scratch may be transferred onto a wafer to make a circuit defective. Additionally, when there is a microscopic unevenness on a surface of a reflective mask, in other words, when there is a radius of curvature in a microscopic area on a surface of a reflective mask, pattern transfer is defective, making it difficult to fabricate a high precision of integrated circuit by transferring a microscopic circuit pattern on a wafer. From this viewpoint, a mask surface (i.e. a film surface) is required to have non-defectiveness for a foreign particle or a scratch, and the interfaces between adjacent films or the interface between a film and a substrate also has non-defectiveness. In particular, with respect to a foreign particle, the number of foreign particles having a size of larger than 60 nm is required to be 20 or below, preferably 5 or below per wafer since the presence of foreign particles causes formation of a convex defect on a film.

With respect to a glass substrate for a magnetic recording substrate, it has been known that in order to prevent foreign particles from being generated as stated earlier, the lateral surfaces of a glass substrate are provided with a mirror-finished surface by polishing. On the other hand, the lateral surfaces of a substrate for a reflective mask have been polished at a normal level. As a result, when a circuit pattern is transferred by employing a reflective mask comprising such a substrate, there is a possibility that an integrated circuit is made defective, decreasing production yield. This is because the surfaces of the reflective mask have non-defectiveness for a foreign particle or a scratch in a insufficient way.

The present invention is proposed, considering the problem stated earlier. It is an object of the present invention to provide a low-expansion glass substrate, which is suited for a base material of a reflective mask employed in the EUVL, and a reflective mask comprising such a low-expansion glass substrate, the glass substrate and the reflective mask being capable of decreasing the number of foreign particles adhering to a substrate surface or reducing the adherence of foreign particles on a substrate surface or a mask surface in mask fabrication.

In order to solve the problem stated earlier, the inventors have observed and analyzed foreign particles adhering to a surface of a low-expansion glass substrate (hereinbelow, referred to as "the glass substrate" in some portions of Description). Additionally, the inventors have investigated the causes of generation of foreign particles and of adherence of foreign particles to a surface of the glass substance. The observation, analysis and investigation have revealed that most of foreign particles are not caused by a residual part of a polishing agent after cleaning or dust coming from a circumstance with a fabrication process being performed but are angular and fine glass fragments (foreign particles) having the same glass components as the glass substrate, i.e., having the same composition of the glass substrate. Additionally, the inventors have revealed that the fine glass fragments are generated from a lateral end wall of the polished glass substrate.

Glass fragments, which have been generated from the lateral end wall of the glass substrate, are formed by removal of contamination, such as ultrasonic cleaning, which affects even the lateral end wall of the glass substrate in a chemical liquid bath or a rinsing bath in a process for cleaning the glass substrate after polishing. Glass fragments, which have been peeled from the lateral end wall by the contamination removal treatment, adhere to a surface of the glass substrate in a cleaning bath and are caused to firmly adhere to the surface by van der Waals force. Since the glass fragments, which have adhered once, firmly adhere to the surface of the glass substrate, it is extremely difficult to remove the adhering glass fragments by cleaning or recleaning conducted just before film deposition.

Based on such recognition, the inventors have found that it is necessary to prevent such glass fragments from being generated from the lateral end wall of the glass substrate. Additionally, the inventors have devoted themselves to provide a solution to prevent such glass fragments from being generated from the lateral end wall of the glass substrate. The inventors have accomplished the present invention based on the following findings:

1) It is possible to prevent glass fragments from being generated by polishing the lateral end wall of the glass substrate to provide the lateral end wall with a mirror-finished surface.

2) It is possible to provide a structure to prevent glass fragments from the lateral end wall of the glass substrate by coating the lateral end wall with a coating film.

3) A crack, which is caused in the lateral end wall when employing a diamond grinding wheel to machine the glass substrate in a grinding process for forming an outer peripheral portion of the glass substrate (called a chamfering process), extends in a process subsequent to the chamfering process to peel glass fragments from the lateral end wall. It is effective to prevent the crack from extending in the subsequent processes by dealing the glass substrate with a chemical liquid capable of dissolving low-expansion glass or low-expansion crystallized glass.

In summary, the present invention provides a low-expansion glass substrate for a reflective mask, which is suited for a base material of a reflective mask employed in the EUV lithography, characterized in that the glass substrate comprise a lateral end wall formed along an outer periphery thereof, at least one of the lateral surface, the chamfered portion and the notched portion being provided with a mirror-finished surface.

It is preferred that the low-expansion glass substrate have the lateral surface, the chamfered portion and the notched portion formed along the outer periphery thereof, at least one of the lateral surface, the chamfered portion and the notched portion being provided with a mirror-finished surface having a surface roughness Ra of 0.05 μm or below.

It is preferred that the low-expansion glass substrate have the lateral surface, the chamfered portion and the notched portion formed along the outer periphery thereof, at least one of the lateral surface, the chamfered portion and the notched portion being provided with a mirror-finished surface having a surface roughness Rmax ranging from 0.05 to 0.50 μm or below.

The present invention also provides a low-expansion glass substrate for a reflective mask, which is suited for a base material of a reflective mask employed in EUV lithography, and which comprises a lateral end wall formed along an outer periphery thereof, the lateral end wall being covered with a protective film for prevention of dust generation.

The present invention also provides a low-expansion glass substrate for a reflective mask, which is suited for a base material of a reflective mask employed in EUV lithography, and which comprises a lateral end wall formed along an outer periphery thereof, the lateral end wall being subjected to etching.

The present invention also provides a reflective mask for EUV lithography, which is obtainable by employing such a low-expansion glass substrate.

In accordance with the present invention, at least one of the lateral surface, the chamfered portion and the notched portion of the low-expansion glass substrate is 1) formed as a mirror-finished surface, 2) covered with a protective film for prevention of dust generation, or 3) subjected to etching. Accordingly, it is possible to prevent fine glass fragments from being generated from the lateral end wall and foreign particles from scattering. Thus, it is possible to obtain a low-expansion glass substrate, which is capable of decreasing the number of foreign particles adhering to a substrate surface and reducing the adherence of foreign particles in mask fabrication, and which is suited for a base material of a reflective mask for the EUVL. It is possible to manufacture a high precision of integrated circuit by transferring an image of a fine circuit pattern on a wafer by means of a reflective mask comprising such a substrate as a base material.

BEST MODE FOR CARRYING OUT THE INVENTION

In order to cope with high integration and high precision of an integrated circuit, it is preferred that the low-expansion glass substrate according to the present invention have a lower coefficient of thermal expansion and a narrower variation in coefficients of thermal expansion. Specifically, it is preferred to employ a low-expansion glass substrate having a coefficient of thermal expansion of 0±30 ppb/° C. at 20° C. It is more preferred to employ a low-expansion glass substrate having a coefficient of thermal expansion of 0±10 ppb/° C. at 20° C. It is particularly preferred to employ an ultra low-expansion glass substrate or ultra low-expansion crystallized glass substrate having a coefficient of thermal expansion of 0±10 ppb/° C. at 20° C. By employing a low-expansion glass substrate having a coefficient of thermal expansion in the above-mentioned range, it is possible to transfer an image of a circuit pattern with high precision in a good way, sufficiently coping with a change in temperatures in semiconductor fabrication. Examples of the base material of the low-expansion glass substrate include low-expansion glass and low-expansion crystallized glass, such as synthetic-quartz glass containing $TiO_2$, ULE (trademark: Corning Cord 7972), or ZERODUR (trademark of Schott A.G.). Among them, synthetic-quartz glass containing $TiO_2$ is excellent as ultra low-expansion glass and is suited for the base material of a reflective mask. The low-expansion glass substrate is fabricated by polishing both upper and lower surfaces of a plate-shaped member, which comprises such low-expansion glass, such ultra low-expansion glass, or low-expansion crystallized glass. The low-expansion glass substrate has a lateral end wall formed along an outer periphery thereof. The low-expansion glass substrate is formed in a circular or square shape so as to substantially conform to the shape of a reflective mask.

Figure 1:
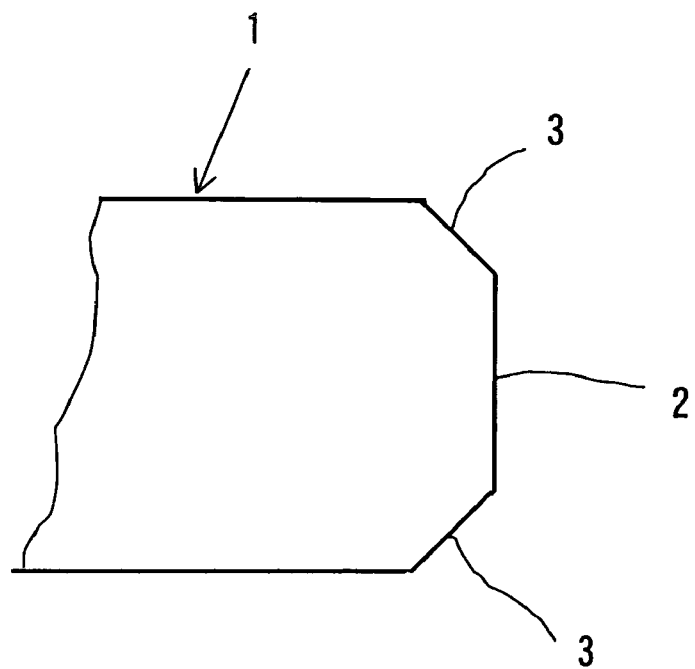
FIG. 1 is a schematic enlarged sectional view of an end portion of the low-expansion glass substrate according to a first preferred embodiment of the present invention.
Figure 3:
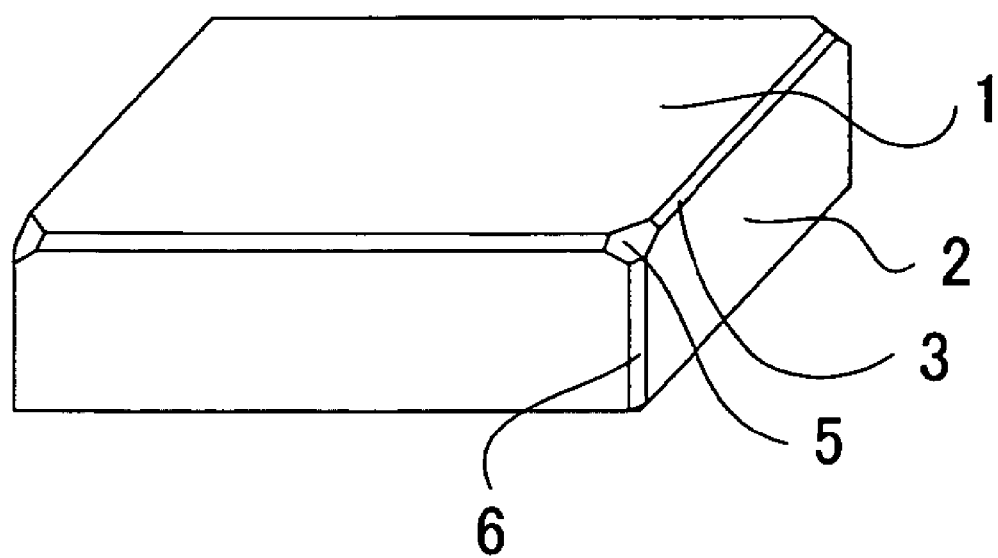
FIG. 3 is a perspective view of the low-expansion glass substrate according to the first embodiment of the present invention.

Now, the present invention will be specifically described, referring to embodiments. It should be clearly understood that the embodiments described below are illustrated only to make the present invention understandable and are not intended to limit the present invention to the embodiments. FIG. 1 is a schematic enlarged sectional view of an end portion of a low-expansion glass substrate 1, and FIG. 3 is a perspective view of low-expansion glass substrate 1. The low-expansion glass substrate 1 normally comprises an end portion including chamfered portions 3 formed by chamfering ridges of the substrate, lateral surfaces 2, as shown in FIG. 1, notched portions 5 for distinguishing a front side and a rear side, and chamfered portions 6, as shown in FIG. 3. In the present invention, the low-expansion glass substrate 1 has a lateral end wall comprising the lateral surfaces 2, the chamfered portions 3, the notched portions 5 and the chamfered portions 6. One of the features of the present invention is that at least one portion of the lateral end wall of the low-expansion glass substrate 1 is formed as a mirror-finished surface by mechanical polishing. Although all of the lateral surfaces 2, the chamfered portions 3, the notched portions 5 and the chamfered portions 6 are normally formed as mirror-finished surfaces by mechanical polishing, only a required portion may be formed as a mirror-finished surface if it is allowable that the effect of preventing glass fragments and foreign particles from being generated is slightly lowered. In FIG. 1, the length of each of the chamfered portions 3 is referred to as a chamfering width. The chamfering width and the shape of the chamfered portions 3 may be properly determined according to the shape of the diamond grinding wheel of a chamfering machine or operating conditions. When the top of the boundary portion between a chamfered portion 3 and a principal face (a surface with a multilayer film deposited thereon or the rear surface thereof), the top of the boundary portion between a lateral surface 2 and a chamfered portion 3 and 6, and the top of the boundary portion of a notched portion 5 and a lateral surface 2, and a chamfered portion 3 and 6 of the low-expansion glass substrate 1 are angular, the tops may be formed in a curved surface, or the chamfered portions may be entirely formed in a curved surface as needed. It should be understood that the lateral end wall of the low-expansion glass substrate 1 may include such a curved surface.

In the present invention, the mirror-finished surface has preferably a surface roughness Ra of 0.05 μm or below, more preferably a surface roughness Ra of 0.03 μm or below. The mirror-finished surface has preferably a surface roughness Rmax ranging from 0.05 to 0.50 μm, more preferably from 0.05 to 0.20 μm. Although there is no particular limitation to the lower limit of Ra, the lower limit of Ra is normally 0.01 μm or above since the polishing load increases as Ra is smaller and since there is no significant difference in the effect of preventing glass fragments from being generated when Ra is a certain value or below. By forming the lateral end wall of the low-expansion glass substrate 1 as a mirror-finished surface having a surface roughness Ra and a surface roughness Rmax in the respective ranges, it is possible not only to prevent glass fragments from being generated from the lateral end wall but also to decrease the amount of generation of glass fragments and reduce the adherence of foreign particle even when the glass fragments are generated. In particular, when each of the lateral surfaces 2, the chamfered portions 3 and 6, and the notched portions 5 is formed as a mirror-finished surface in the range stated earlier, the effect is significant. It should be understood that when each of the boundary portion of a principal face and a chamfered portion 3, the boundary portion of a lateral surface 2 and a chamfered portion 3 and 6, the chamfered portions 3 and 6, the boundary portion of the notched portions 5 and the chamfered portions 3 and 6 of the low-expansion glass substrate 1 is formed in a curved surface as stated earlier, the curved surface may be also polished into a mirror-finished surface as one portion of the lateral end wall. Although the lateral surfaces 2 of the lateral end wall have substantially the same Ra and Rmax as the chamfered portions 3 of the lateral surface since the lateral surfaces and the chamfered portions are normally polished in the same way, the lateral surfaces may have different Ra and Rmax from the chamfered portions.

In order to provide the lateral end wall of the low-expansion glass substrate 1 with a mirror-finished surface having a surface roughness in the range stated earlier in the present invention, a polishing method and a polishing machine, which have been known in the polishing or chamfering technical field for glass sheets, may be employed. In a specific example, the low-expansion glass substrate 1 is mechanically polished by employing a grinding wheel (such as a diamond grinding wheel) for chamfering the low-expansion glass substrate 1, a polisher for using a polishing agent or polishing slurry to polish and provide a mirror-finished surface to the end surface chamfered by the grinding wheel, and another tool. The lateral end wall of the low-expansion glass substrate 1 may be polished so as to be provided with a mirror-finished surface having a surface roughness in the range stated earlier by properly combining polishing agents, polishing slurry or the like having different kinds or particle diameters, or changing the kind of the polisher. As the polisher, buff, various kinds of polishing pads or the like, which have been known as a polishing tool for finishing or burnishing glass, are applicable. As the polishing agent, slurry of a cerium oxide, a red iron oxide, a zirconium oxide, colloidal silica or the like.

It is preferred that the lateral end wall of the low-expansion glass substrate 1 be polished in association with polishing the principal faces of the low-expansion glass substrate 1. The principal faces of the low-expansion glass substrate 1 are polished by employing a polisher to polish glass surfaces required as a reflective mask after lapping a plate-shaped member cut out from, e.g., an ingot. In order that glass fragments, which are generated by polishing the lateral end wall, is prevented from adhering to or damaging the polished principal faces, it is preferred that the lateral end wall be polished so as to have a mirror-finished surface before the principal faces are subjected to fine finishing. In other words, in a preferred embodiment, the lateral end wall of the low-expansion glass substrate 1 (to be exact, a base material for the low-expansion glass substrate) is firstly roughly ground and chamfered by, e.g., a diamond grinding wheel, the principal faces are lapped, the chamfered lateral end wall is polished so as to be provided with a mirror-finished surface, and finally the principal faces are subjected to fine finishing by a polisher. However, the order of these steps is not limited to the order stated earlier and may be changed. Although a lateral surface 2 and a chamfered portion 3 are simultaneously polished in a normal case when the chamfered lateral end wall of the low-expansion glass substrate 1 is polished so as to be provided with a mirror finished surface, the lateral surface 2 and the chamfered portion 3 may be independently polished.

Figure 2:
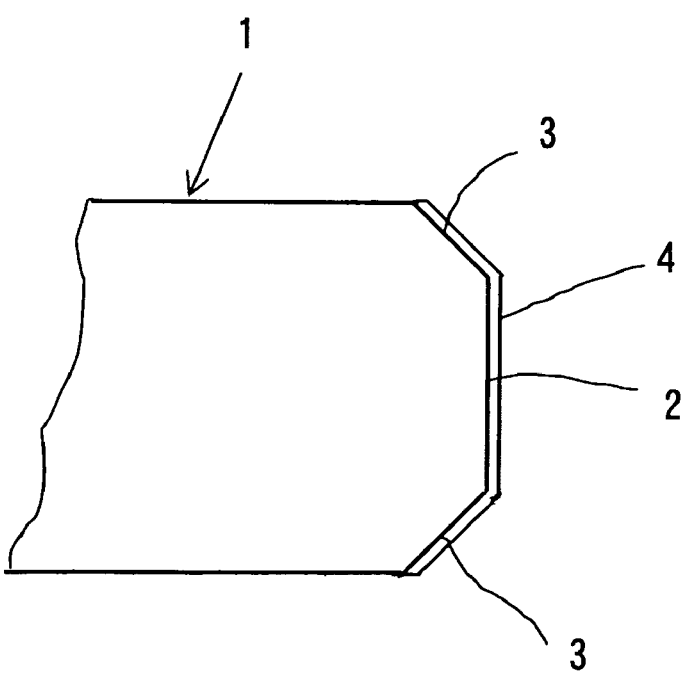
FIG. 2 is a schematic enlarged sectional view of an end portion of the low-expansion glass substrate according to a second embodiment of the present invention.

FIG. 2 shows another embodiment of the present invention. This embodiment is characterized in that the lateral end wall of the low-expansion glass substrate 1 is covered with a protective film 4 for prevention of dust generation as shown in FIG. 2. In order to prevent dust, such as glass fragments, from being generated from the lateral end wall, it is preferred that the protective film 4 be applied to the lateral surfaces 2 and the chamfered portions 3 of the low-expansion glass substrate 1 so as to cover the entire lateral end wall as in this embodiment. The protective film 4 comprises a material, which can be firmly bonded to the lateral end wall of the low-expansion glass substrate 1, and from which neither impurities nor foreign substrate harmful to the reflective mask are generated after bonding. As the protective film 4, e.g., a metal film can be most preferably employed in a normal case. Examples of the metal for such a metal film include chromium, gold, silver, titanium and tin. Such metal or a metal oxide thereof may be solely employed or employed as an alloy with other metal. Among them, chromium and a chromium oxide are preferred in terms of cost or ease in film deposition. There is no limitation to the way for depositing the protective film 4 with metal is not specified. For example, the protective film may be deposited by sputtering, vapor deposition, thermal spraying or the like. The thickness of the protective film 4 is preferably from about 0.01 to about 0.20 μm. The protective film 4 may comprise a material other than a metal, such as Si or $SiO_2$.

When the protective film 4 is deposited on the lateral end wall of the low-expansion glass substrate 1, it is preferred that the lateral end wall be mechanically polished to a normal degree (Ra: about 0.03 to about 0.05 μm) or above before formation of the protective film. By preliminarily polishing the lateral end wall of the low-expansion glass substrate 1 to provide the lateral end wall with a proper surface quality as stated earlier, it is possible to easily deposit the protective film 4 and to obtain a reliable coating.

As another embodiment of the present invention, there is a method for subjecting the lateral end wall of the low-expansion glass substrate 1 to etching. This method is that the lateral end wall having angular convexo-concave portions, wherein glass fragments are likely to be generated in the low-expansion glass substrate, is dealt with an etchant to chemically remove such angular convexo-concave portions, in particular convexo portions. When this etching treatment is performed with a chemical liquid capable of dissolving a glass substrate, such as a solution of HF, a mixed solution of a combination of HF and another acid, or a solution of alkali, it is possible to obtain a desired result. It is effective to carry out the etching process after the chamfering process. In particular, it is preferred to carry out the etching process before final polishing.

Since the sharp edges of angular convex portions, wherein glass fragments are likely to be generated, are removed from the lateral end wall of the low-expansion glass substrate 1 thus etched, the lateral end wall is provided with a smooth surface even if the lateral end wall has convexo-concave portions. Thus, it is possible to decrease the number of foreign particles adhering to a mask surface and to reduce the adherence of foreign particles to a mask surface in mask fabrication since the generation of glass fragments, which can make a transferred circuit pattern image defective, can be prevented during subsequent handling, fabrication of a reflective mask and fabrication of an integrated circuit in the case of the low-expansion glass substrate 1 thus etched.

By applying this treatment to the lateral end wall, it is possible to reduce scattering of glass fragments from the lateral end wall and to decrease the number of foreign particles adhering to the lateral end wall even if the substrate temperature is increased to 20° C. or above. Thus, it is possible to reduce scattering of glass fragments and foreign particles from the lateral end wall.

EXAMPLE

As a typical example of the low-expansion glass substrate, an ingot of synthetic quartz glass, which contains $TiO_2$ produced by a flame hydrolysis method, was prepared. Such synthetic quartz containing $TiO_2$ has a coefficient of thermal expansion of 5 ppb/° C. or below at 20° C. and is a material appropriate as ultra-low-expansion glass for EUVL. By employing an inner ID-saw (diameter saw) slicer, the ingot was cut out into plates having a length of 153.0 mm, a width of 153.0 mm and a thickness of 6.75 mm, preparing forty plate-shaped specimens of such synthetic quartz glass. Then, each of the specimens was chamfered so as to have a length of 152 mm and a width of 152 mm in overall size and a chamfered width of from 0.2 to 0.4 mm by employing a #120 diamond grinding wheel in a commercially available NC chamfering machine.

Then, the principal faces of each of the plate-shaped specimens made of such synthetic quartz glass (hereinbelow, referred to as the base materials) were polished until each of the base materials had a thickness of 6.63 mm by employing a 20B double sided lapping machine (manufactured by SPEEDFAM CO., LTD.) and by employing, as polishing agent, slurry wherein 18 to 20 mass % of GC#400 (the product name of a product manufactured by FUJIMI INCORPORATED) essentially composed of SiC was suspended in filtered water.

Additionally, each of the base materials was polished until each of the base materials had a thickness of 6.51 mm by employing another 20B double sided lapping machine and by employing, as a polishing agent, slurry wherein 18 to 20 mass % of FO#1000 (the product of a product manufactured by FUJIMI INCORPORATED) containing $Al_2O_3$ as a main component was suspended in filtered water. Then, the base materials were divided into two groups of Group A and Group B, each group containing twenty base materials.

First, the base materials in Group A were classified as comparative examples to be subjected to the conventional processing, and those base materials were subjected to a polishing process after the base materials with a lateral end wall chamfered were lapped. The base materials in Group B had lateral end walls polished, after lapping, by about 30 μm along the outer periphery of each of the base materials to be provided with a mirror-finished surface by employing, as polishing cloth, 3910-0402 (the product name of a product manufactured by Maruishi Sangyo) made of velour and by employing, as a polishing agent, slurry wherein 25 to 30 mass % of MIREK 801A (the product name of a product manufactured by Mitsui Mining and Smelting Co., Ltd.) containing a cerium oxide as a main component was suspended in filtered water. The surface roughness of each of the lateral end wall was measured by a contact type surface roughness checker, SURFCOM 1400D (the product name of a product manufactured by TOKYO SEIMITSU CO., LTD.). It was revealed that Group A had a surface roughness Ra of 0.035 μm as the average value and a surface roughness of Rmax of 0.085 μm as the average value, and that Group B had a surface roughness Ra of 0.021 μm as the average value and a surface roughness of Rmax of 0.045 μm as the average value. This lateral end wall treatment may be conducted by a polishing method using a brush.

It was verified that no obvious foreign particles were scattered from the lateral end walls since this lateral end wall treatment was able to reduce the scatter of glass fragments from the lateral end walls and to decrease the number of foreign particles adhering to the lateral end walls even if the temperature of the substrates was increased to 20° C. or above.

Next, each of the principal faces of the respective base materials in the two groups was polished by about 50 μm as first polishing by employing a 20B double-sided polishing machine, by employing, as polishing cloth, LP66 (the product name of a product manufactured by Rhodes) made of urethane, and by employing, as a polishing agent, slurry wherein 10 to 12 mass % of MIREK 801A (the product name of a product manufactured by Mitsui Mining and Smelting Co., Ltd.) containing a cerium oxide as a main component was suspended in filtered water.

Additionally, each of the principal faces of the respective base materials in the two groups was polished by about 10 μm by employing a 20B double-sided polishing machine and by employing, as polishing cloth, Ciegal 7355 (the product of a product manufactured by Toray Coatex Co., Ltd.) made of foamed urethane (second polishing). Then, each of the principal faces was finally polished by another polishing machine (third polishing). In the final polishing, colloidal silica (COMPOL 20: the product name of a product manufactured by FUJIMI INCORPORATED) and Bellatrix K7512 (the product name of a product manufactured by Kanebo, Ltd.) were employed as a polishing agent and as polishing cloth, respectively.

Subsequently, the base materials in both groups were cleaned by a multistage automatic cleaning machine including a first tank containing a hot solution of sulfuric acid and a hydrogen peroxide solution, and a third tank containing a solution of neutral surface active agent. Then, particles (foreign particles) that existed on a surface (reflective surface) of the respective base materials and had a particle size of 60 nm or above were measured by a surface scanner for a photomask, M1350 (manufactured by Lasertec Corporation). The measurement results are shown in Table 1.

TABLE 1

| Specimen No. | Group A | Group B |
| --- | --- | --- |
| 1 | 38969 | 8 |
| 2 | 21747 | 6 |
| 3 | 8927 | 5 |
| 4 | 17362 | 4 |
| 5 | 48538 | 9 |
| 6 | 37289 | 3 |
| 7 | 22740 | 6 |
| 8 | 54882 | 4 |
| 9 | 29653 | 7 |
| 10 | 66348 | 6 |
| 11 | 43784 | 6 |
| 12 | 56972 | 2 |
| 13 | 67438 | 8 |
| 14 | 31503 | 7 |
| 15 | 49163 | 4 |
| 16 | 28729 | 5 |
| 17 | 14078 | 8 |
| 18 | 27965 | 4 |
| 19 | 58931 | 7 |
| 20 | 48933 | 8 |
| Average | 38647 | 5.8 |

(unit: number of particles/surface)

As clearly seen from Table 1, Group A has a much greater number of foreign particles in comparison of the average numbers of particles in the respective groups, each containing 20 base materials. On the other hand, the number of foreign particles having a particle diameter of 60 nm or above in Group B is less than 6, which is not much greater than 20. The greatest number of foreign particles in Group B is 9. This reveals that the method employed in Group B, wherein the lateral end walls are polished so as to be provided with a mirror-finished surface is effective.

When a chromium oxide film is deposited by a thickness of 1,000 Å on the lateral end walls of the base materials in Group A by sputtering after cleaning, or when the lateral end walls of the base materials in Group A were rinsed in an ultrasonic cleaning tank by running pure water after having been immersed in a solution of 5 mass % of HF for 10 minutes, the number of foreign particles in the base materials of Group A can be reduced to the same degree as the base materials of Group B.

INDUSTRIAL APPLICABILITY

In accordance with the present invention, it is possible to prevent foreign particles from scattering since the generation of fine glass fragments from the lateral end wall of a low-expansion glass substrate and the adherence of foreign particles to the end surface portion are minimized. Thus, it is possible to obtain a reflective mask for the EUVL, which is capable of decreasing the number of glass fragments and foreign particles adhering to a substrate surface and reducing the adherence of glass fragments and foreign particles to a substrate surface in mask fabrication. Accordingly, it is possible to manufacture a high precision of integrated circuit by transferring an image of a fine circuit pattern on a wafer by means of such a reflective mask.

The entire disclosure of Japanese Patent Application No. 2004-127307 filed on Apr. 22, 2004 including specification, claims, drawings and summary is incorporated herein by reference in its entirety.

What is claimed is:

1. A low-expansion glass substrate for a reflective mask, which is suited for a base material of a reflective mask employed in a lithographic process in semiconductor fabrication, the low-expansion glass substrate comprising a lateral surface, a chamfered portion and a notched portion formed along an outer periphery thereof, all of the lateral surface, the chamfered portion and the notched portion having a surface roughness Ra of 0.05 μm or below.

2. The low-expansion glass substrate according to claim 1, wherein at least one of the lateral surface, the chamfered portion and the notched portion formed along the outer periphery of the low-expansion glass substrate is provided with a mirror-finished surface having a surface roughness Rmax ranging from 0.05 to 0.50 μm.

3. A reflective mask comprising the low-expansion glass substrate for a reflective mask, defined in claim 2.

4. The low-expansion glass substrate according to claim 1, further comprising an ultra low-expansion glass substrate or ultra low-expansion crystallized glass substrate having a coefficient of thermal expansion of 0±10 ppb/° C. at 20° C.

5. A reflective mask comprising the low-expansion glass substrate for a reflective mask, defined in claim 4.

6. A reflective mask comprising the low-expansion glass substrate for a reflective mask, defined in claim 1.

7. A low-expansion glass substrate for a reflective mask, which is suited for a base material of a reflective mask employed in a lithographic process, the low-expansion glass substrate comprising a lateral surface formed along an outer periphery thereof and a notched portion, the lateral surface and the notched portion being covered with a metal film, a film of Si or a film of $SiO_2$.

8. The low-expansion glass substrate according to claim 7, further comprising an ultra low-expansion glass substrate or ultra low-expansion crystallized glass substrate having a coefficient of thermal expansion of $0\pm10$ ppb/° C. at 20° C.

9. A reflective mask comprising the low-expansion glass substrate for a reflective mask, defined in claim 8.

10. A reflective mask comprising the low-expansion glass substrate for a reflective mask, defined in claim 7.

11. A low-expansion glass substrate for a reflective mask, which is suited for a base material of a reflective mask employed in a lithographic process, the low-expansion glass substrate comprising a lateral surface formed along an outer periphery thereof and a notched portion, wherein the lateral surface and the notched portion are etched.

12. The low-expansion glass substrate according to claim 11, further comprising an ultra low-expansion glass substrate or ultra low-expansion crystallized glass substrate having a coefficient of thermal expansion of $0\pm10$ ppb/° C. at 20° C.

13. A reflective mask comprising the low-expansion glass substrate for a reflective mask, defined in claim 12.

14. A reflective mask comprising the low-expansion glass substrate for a reflective mask, defined in claim 11.

* * * * *